United States Patent [19]

Haque

[11] 4,335,355

[45] Jun. 15, 1982

[54] CMOS OPERATIONAL AMPLIFIER WITH REDUCED POWER DISSIPATION

[75] Inventor: Yusuf A. Haque, San Jose, Calif.

[73] Assignee: American Microsystems, Inc., Santa Clara, Calif.

[21] Appl. No.: 234,239

[22] Filed: Feb. 13, 1981

Related U.S. Application Data

[63] Continuation-in-part of Ser. No. 80,153, Sep. 28, 1979, Pat. No. 4,284,957.

[51] Int. Cl.³ .............................................. H03F 3/45
[52] U.S. Cl. ..................................... 330/253; 330/255; 330/264; 330/300
[58] Field of Search ............... 330/253, 255, 264, 269, 330/300

[56] References Cited

U.S. PATENT DOCUMENTS

| | | | |
|---|---|---|---|
| 3,723,892 | 3/1973 | Julie | 330/300 |
| 3,984,780 | 10/1976 | Hsiao et al. | 330/253 |
| 4,000,474 | 12/1976 | Tokokoro | 330/264 |
| 4,267,517 | 5/1981 | Iida et al. | 330/264 X |

*Primary Examiner*—James B. Mullins

*Attorney, Agent, or Firm*—Alan H. MacPherson; Steven F. Caserza; Richard Franklin

[57] ABSTRACT

An operational amplifier (10a) comprised of MOSFET elements is disclosed which provides for a variable drive for an output stage that results in lower power dissipation and increased gain factor over comparable circuits using constant bias drive for the output stage. A bias section (14) comprised of complementary MOS elements (24, 26) is connected to a single MOSFET (40) that furnishes constant current to the signal input section of a differential amplifier section (20). The output of this differential amplifier is furnished by one path (70) directly to one complementary MOSFET element (72) of an output stage (18) and by another path (114) to a level shift section (16) which provides an output to a second complementary MOSFET element (80) of the output stage. Thus, the circuit functions under class A-B operation at low power dissipation and provides high open loop gain. This invention utilizes three MOSFET elements (104, 106, 108) in the level shift section and an output stage having an NPN transistor (120) in combination with an N-channel MOSFET (122).

3 Claims, 4 Drawing Figures

FIG_1

FIG_2

FIG_3

CMOS OPERATIONAL AMPLIFIER WITH REDUCED POWER DISSIPATION

BACKGROUND OF THE INVENTION

This is a continuation-in-part of United States patent application Ser. No. 06/080,153 filed Sept. 28, 1979, now U.S. Pat. No. 4,284,957 and assigned to American Microsystems, Inc., 3800 Homestead Road, Santa Clara, Calif. 95051. This invention relates to operational amplifiers and more particularly, to such devices that may be utilized as building blocks in integrated circuits.

In the development of data transmission and communication systems, efforts have been made to utilize linear integrated circuit devices, such as those incorporating complementary metal-oxide-silicon (CMOS) large scale integrated (LSI) technology. Operational amplifiers are key building blocks in many circuits used for such systems. However, with previous operational amplifiers comprised of integrated MOSFET elements, excessive power dissipation and limited available open loop gain were problems that limited their use, particularly, where relatively large numbers of such circuits were required for system operation. Previous conventional operational amplifiers using CMOS LSI technology were designed with a constant bias drive for the output stage. This factor contributed to the problem of excessive power requirements and also, limited loop gain.

It is, therefore, one object of the invention to provide an improved operational amplifier circuit that solves the aforesaid problems and provides for relatively low power dissipation.

Another object of the present invention, is to provide an operational amplifier that produces an increased gain factor over comparable circuits using constant bias drive for the output stage.

Another object of the present invention, is to provide an operational amplifier that has an increased linear signal swing range compared to what was previously achievable with an operational amplifier having a constant bias for the output stage.

Yet another object of the present invention, is to provide an operational amplifier comprised of CMOS MOSFET elements which provide relatively low power dissipation and increased open loop gain.

Another object of this invention is to provide an operational amplifier having a low output impedance.

SUMMARY OF THE INVENTION

Briefly described, the present invention provides an operational amplifier circuit comprised of MOSFET elements which combine to provide a variable drive for an output stage that results in a lower power dissipation and higher open loop gain compared with previous operational amplifier circuits having constant bias drive for the output stage.

In one embodiment, a combination of five MOSFET devices form a differential input stage which is connected to a pair of MOSFET's used to bias the circuit. An additional pair of MOSFET's form a high impedance output stage of the amplifier. Another pair of MOSFET devices are connected as an intermediate level shift section to drive one of two output stage MOSFET's so as to provide Class A-B operation, resulting in significantly reduced power dissipation. Thus, instead of the output signal being produced by one MOSFET supplied with a constant bias, it is supplied alternately from the two output MOSFET's with some degree of overlap. This circuit arrangement and its mode of operation also increases the open loop gain of the amplifier compared to what it would be if the output stage device was driven by a constant bias source.

In another embodiment of the invention for driving particularly low impedance loads (e.g., 300 ohms) but still with a relatively low power dissipation, a supplementary output stage is used comprised of a vertical NPN bipolar transistor in combination with a large N-channel MOS device which performs a pull down function. Again, the gate of this pull down output device has a variable voltage drive which results in Class A-B operation of the output section and serves to reduce the circuit power dissipation from what would normally be achieved using a constant bias drive for the output stage.

Other objects, advantages and features of the invention will become apparent from the following detailed description of similar embodiments, presented in conjunction with the accompanying drawing.

DETAILED DESCRIPTION OF INVENTION EMBODIMENTS

Figure 1:
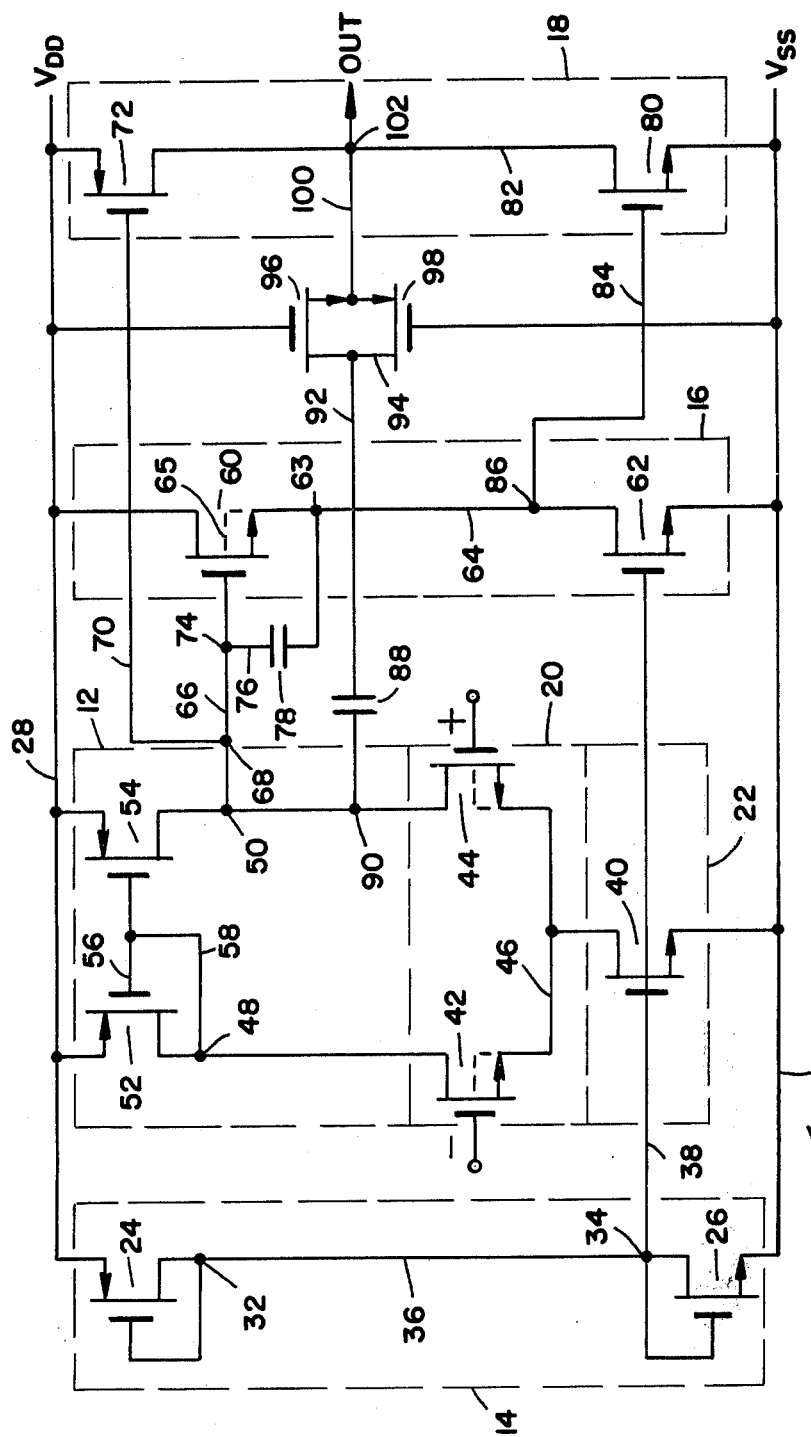
FIG. 1 is a circuit diagram for an operational amplifier embodying the principles of the present invention.

With reference to the drawing, FIG. 1 shows the circuit diagram of a first operational amplifier 10 embodying principles of the present invention and comprised of MOSFET elements. In general, this operational amplifier is comprised of a differential amplifier 12, connected to a biasing network 14, and an intermediate level shift stage 16, connected to an output stage 18. The differential amplifier typically includes an input stage 20 and a constant current source 22.

All of the transistor elements of the various components of the operational amplifiers 10 are MOSFET devices and for proper operation of the operational amplifier circuit, these devices must operate in the saturation mode as opposed to the linear mode. The function of the bias network 14 is to assure that all the MOSFET devices of the circuit operate in the proper saturation region. The bias network comprises two MOSFET devices 24 and 26, each having source, drain and gate electrodes. The source electrode of transistor 24 is connected to a positive voltage supply via a power lead 28 and the source of transistor 26 is connected by a lead 30 to a negative power supply $V_{SS}$. The drain and gate electrodes of transistor 24 are connected to a junction 32 and the drain and gate electrodes of transistor 26 are connected to a junction 34. These junctions 32 and 34 are interconnected by a lead 36, and a lead 38 from the junction 34 provides the biasing voltage for the circuit.

The constant current source 22 comprises a MOSFET device 40 whose gate is connected to the biasing voltage lead 38. The source of transistor 40 is connected to the negative power lead 30 and its drain is connected to the input stage 20 of the differential amplifier.

This input stage comprises a pair of MOSFET devices 42 and 44 whose respective source electrodes are connected to a common lead 46 which is also connected to the drain of transistor 40. The drain electrode of the device 42 is connected to a junction 48 of the differential amplifier and the drain electrode of device 44 is connected to a junction 50 of the differential amplifier. The gate of input device 42 is connected to a negative input terminal of the operational amplifier and the gate of device 44 is connected to its positive input terminal. The substrates of transistors 44 and 42 are connected to lead 46 in order to eliminate body effect in these devices.

The load section of the differential amplifier 12 comprises a pair of MOSFET devices 52 and 54 whose source terminals are both connected to the positive power lead 28. The gates of these devices are interconnected by a lead 56 which is also connected by a lead 58 to the junction 48.

The intermediate level shift stage 16 of the operational amplifier 10 comprises a pair of MOSFET devices 60 and 62 connected in series between the positive and negative power leads. The drain of device 60 is connected to the positive power lead 28, and the source of device 62 is connected to the negative power lead 30.

The source of MOS transistor 60 is connected by a lead 64 to the drain of device 62. The gate of device 60 is connected by a lead 66 from the junction 50. The substrate of device 60 is connected to a node 63 (as indicated by the dotted line 65) in the lead 64, which has the effect of eliminating body effect in the transistor. A first junction 68 in the lead 66 is connected by a lead 70 to the gate of a MOSFET device 72 in the output stage 18 of the operational amplifier 10. A second junction 74 in the lead 66 is connected by a lead 76 to one side of a capacitor 78 whose other side is connected to the lead 64.

The output stage 18 comprises the MOSFET device 72 whose source is connected to the positive power lead 28 and a second MOSFET device 80 whose source is connected to the negative power lead 30. The drain electrodes of these two transistors are interconnected by a common lead 82. The gate of MOSFET 80 is connected by a lead 84 to a junction 86 in the lead 64 between the devices 60 and 62.

A frequency compensation means for the operational amplifier is preferably provided between the differential amplifier section 12 and the output stage 18. It comprises a capacitor 88 ($C_2$) having one side connected to a junction 90 in the output side of the differential amplifier 12. The other side of this capacitor is connected by a lead 92 to an interconnection lead 94 between the drain electrodes of two MOSFET devices 96 and 98, whose sources are both connected to one end of a lead 100, whose other end terminates at an output junction 102 for the operational amplifier 10 in the lead 82. The gate of MOSFET 96 is connected to power lead 28 and the gate of MOSFET 98 is connected to lead 30. The function of this frequency compensation means is described in greater detail in my co-pending application, Ser. No. 079,341, filed Sept. 27, 1979.

The operation of operational amplifier 10 may be described as follows:

Upon the application of power on leads 28 and 30, the bias network 14 develops a voltage in lead 38 which is used to bias the differential amplifier constant current source 40, as well as the intermediate level shift stage 16. With zero input voltages on transistors 42 and 44, and upon application of bias voltage, the differential amplifier operates in a saturation mode. Now, upon application of input signals on the gates of transistors 42 and 44, the differential amplifier amplifies the received differential signal and an output is available on its output node 50. The output of the differential amplifier now is further amplified by the output gain stage or output section 18 which has a Class A–B drive. One side (transistor 72) of this stage is driven directly by the output of the differential amplifier from its node 50. The other side of the output stage (transistor 80) is driven by the level shifted output of the differential amplifier. The level shift is achieved using transistors 60 and 62.

The overall effect of this Class A–B drive arrangement is that the impedance presented between the power supply conductors 28 and 30 is higher than it would be if device 80 was always turned on to send or receive a specified current as in prior circuits of this type. Since in the operational amplifier 10 of the present invention, the output transistor 80 turns on substantially when the output transistor 72 goes off (with some degree of overlap) in response to an input from the differential amplifier, considerably less power is dissipated in the circuit during its operation.

The reason for this power dissipation may be further explained as follows: Assuming a constant voltage applied to the gate of transistor 80, which acts as a load device for the output stage 18, now, when input signals are applied to the operational amplifier inputs and are transmitted to the gate of transistor 80, an amplified version of this signal is available at the output node 102. The power dissipation on this stage is determined by the current flowing through transistor 80 (for a capacitive load on node 102). This power dissipation is relatively constant. However, if the bias drive on the gate of transistor 80 were varied, the current flowing through it is varied. In the present invention, when the output of the differential amplifier at node 50 goes to a high voltage, the P-channel MOS device 72 tends to turn off, but the N-channel MOS device 80 tends to turn on hard. Conversely, when the differential amplifier output at node 50 goes low, the device 72 turns on hard but the device 80 tends to turn off. At no time are both devices full on, and therefore power dissipation is reduced compared to if a constant current was flowing through device 80.

Another advantage of the operational amplifier 10 is increased gain provided by its operation. The gain of the output stage 18 is a function of the transconductance ($g_m$) and the load impedance of the output stage. When constant bias drive is used, the load impedance is also constant. However, in the present invention, the load is variable. When the differential amplifier output at node 50 goes low, its output turns on transistor 72. The gain G of the amplifier now is the transconductance ($g_m$) of transistor 72, multiplied by the load resistance ($R_L$) of transistor 80. Since the output of the differential amplifier goes low, the gate drive for transistor 80 goes low and the impedance ($1/g_m$) of transistor 72 increases; hence, the gain is increased.

A further advantage of the circuit 10 is that the linear signal swing range is increased over that achieveable in circuits having a constant bias drive. The reason for this may be explained as follows: To remain in the linear signal swing range, output stage transistors 80 and 72 must operate in their saturation region. Since the gate voltage of transistor 80 varies (decreases if the output voltage at node 50 from the differential amplifier decreases), transistor 80 would stay in the saturation region of operation for a larger signal swing (compared to an arrangement wherein transistor 80 had a constant bias drive on its gate). This increase in linear signal swing gives the operational amplifier a larger usable dynamic range.

Figure 2:
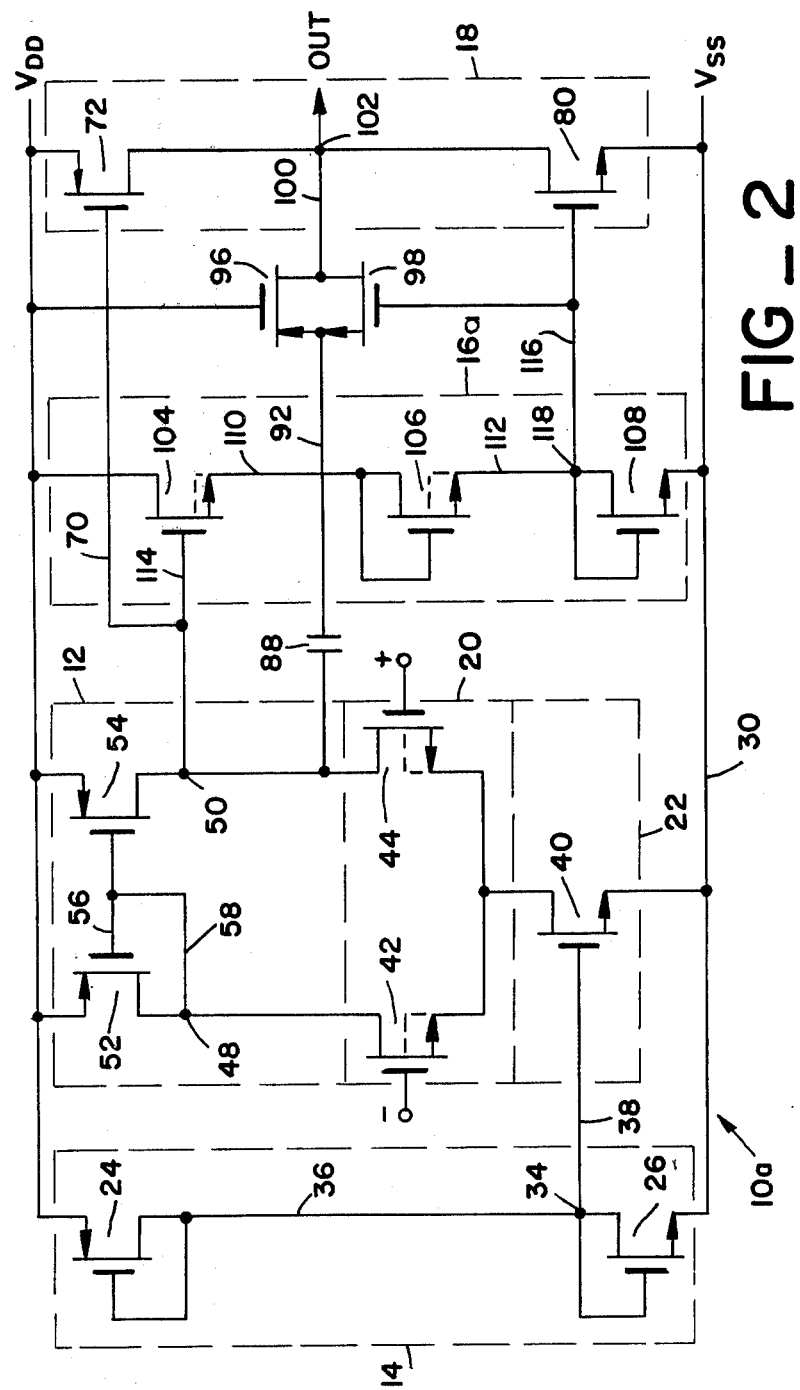
FIG. 2 is a circuit diagram for a modified form of operational amplifier according to the invention.

A modified circuit 10a for another high output impedance operational amplifier is shown in FIG. 2. Here, the elements of the bias section, the constant current source, the differential amplifier, the frequency compensation section, and the output section, are all identical to those of circuit 10. However, in this embodiment, which also provides Class A-B drive, an intermediate drive or level shift section 16a is provided comprised of three MOSFET devices 104, 106 and 108. The drain of MOSFET 104 is connected to power lead 28 and its source is connected via a lead 110 to the drain of MOSFET 106. The source of MOSFET 106 is connected via a lead 112 to the drain of MOSFET 108 whose source is connected to the $V_{SS}$ line 30. The gate of MOSFET 104 is connected by a lead 114 from the output node 50 of the differential amplifier 12, and lead 114 is also connected to the gate of output MOSFET 72. The gate of MOSFET 106 is connected to its source on lead 110 and similarly, the gate of MOSFET 108 is connected to its source on lead 112. The drive section 16a is connected to the output section via a lead 116 extending from a junction 118 in the lead 112.

The operation of this modified operational amplifier 10a is substantially the same as that of the operation amplifier 10, except for the function of the level shift section 16a. In this case, the three devices 104, 106 and 108 are used to implement a self biased, source-follower type level shift circuit. The output signal from the differential amplifier drives the gate of a transistor 104 and the transistors 106 and 108 act as load devices. The signal on the gate of 104 appears on lead 110 with an appropriate gain factor. Device 108 is used to further level shift to signal on lead 110 to develop a signal on lead 112 which is suitable to drive output device 80. In this embodiment, the power dissipation is further reduced by using self-biased loads as opposed to the bias load of the level shift section 16 of operational amplifier 10.

Figure 3:
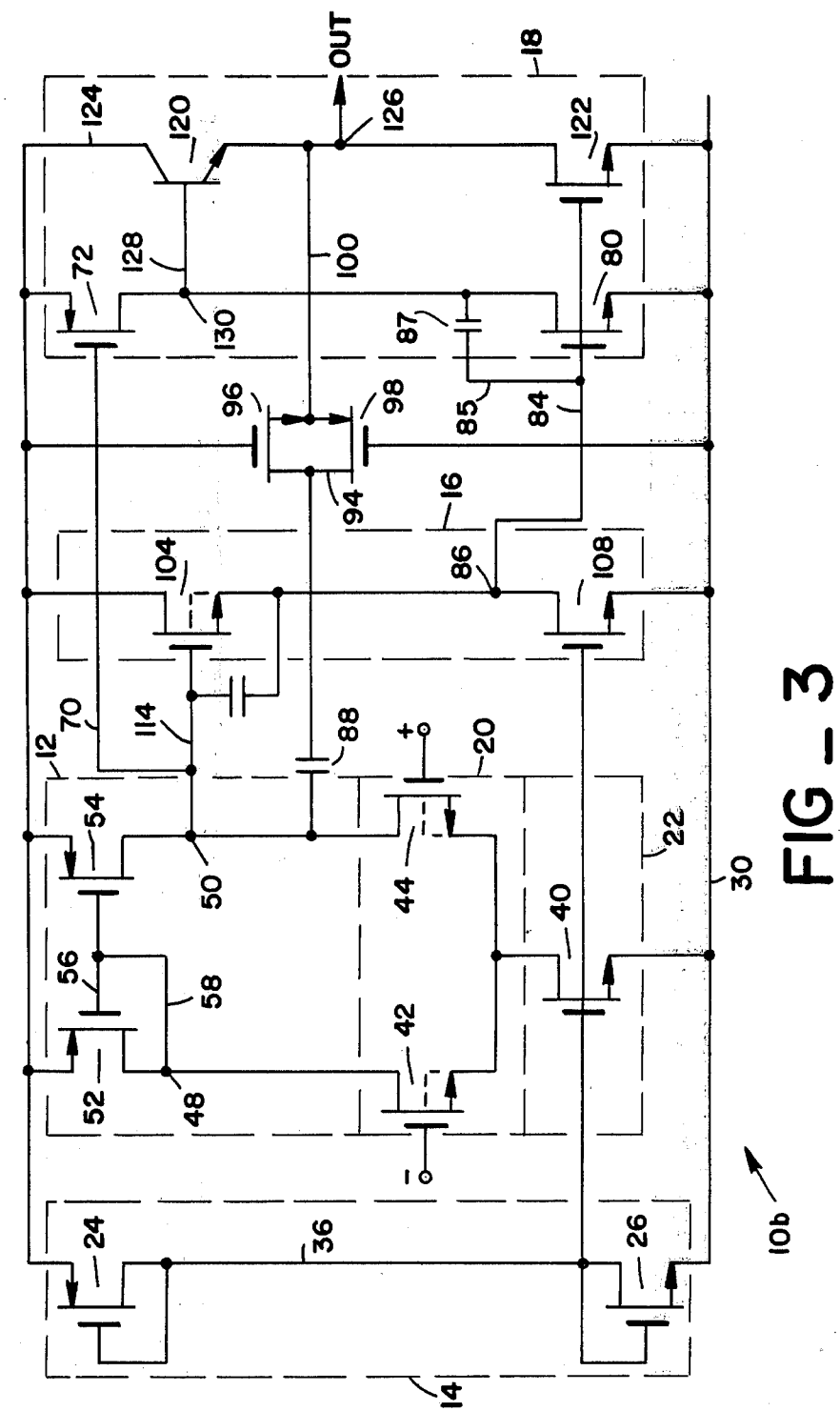
FIG. 3 is a circuit diagram for an operational amplifier comprising yet another embodiment of the invention.

In a further modified version of the present invention, a low output impedance operational amplifier circuit 10b, is shown in FIG. 3. Here again, the bias section, the constant current source, the differential amplifier, the intermediate drive section and the output section, are comprised of the same elements as with the embodiment of FIG. 1. Connected to the output section and forming part of it, is a supplemental output stage comprised of a vertical NPN transistor 120 and a MOSFET 122. The transistor has a collector connected by a lead 124 to the $V_{DD}$ power lead 28 and an emitter connected by a lead 126 to the drain of MOSFET 122 whose source is connected to the $V_{SS}$ lead 30. The base of transistor 120 is connected via a lead 128 to an output junction 130 between the MOSFETS 72 and 80 and the gate of MOSFET 122 is connected via an extension of the lead 84 from the level shift junction 86. In a lead 85 between the leads 84 and node 130, is a capacitor 87 which is used to frequency compensate the output stage.

In the operational amplifier 10b, the supplemental output stage enables it to drive low impedance resistive loads (i.e., 300 ohms). Such low impedance output sections normally would dissipate large amounts of power. However, in the present invention, such power dissipation is minimized by using Class A-B operation for the supplemental output stage. For example, when the output of the differential amplifier goes high, device 72 again turns off and devices 80 and 122 both turn on. At this point, the node 130 in the first output stage 18 tends to go towards $V_{SS}$ as does the voltage in lead 126. Thus, the NPN transistor 120 goes off, which results in reduced power dissipation. Conversely, when the output of the differential impedance goes low, device 72 turns on hard, and devices 80 and 122 turn off. Thus, node 130 goes high and turns on the NPN transistor 120. Again, when device 120 is on, 122 is off and vice versa and power dissipation is minimized. The turn on/turn off times have some overlap to prevent cross over distortion, but this does not significantly affect the overall reduction in power dissipation.

Figure 4:
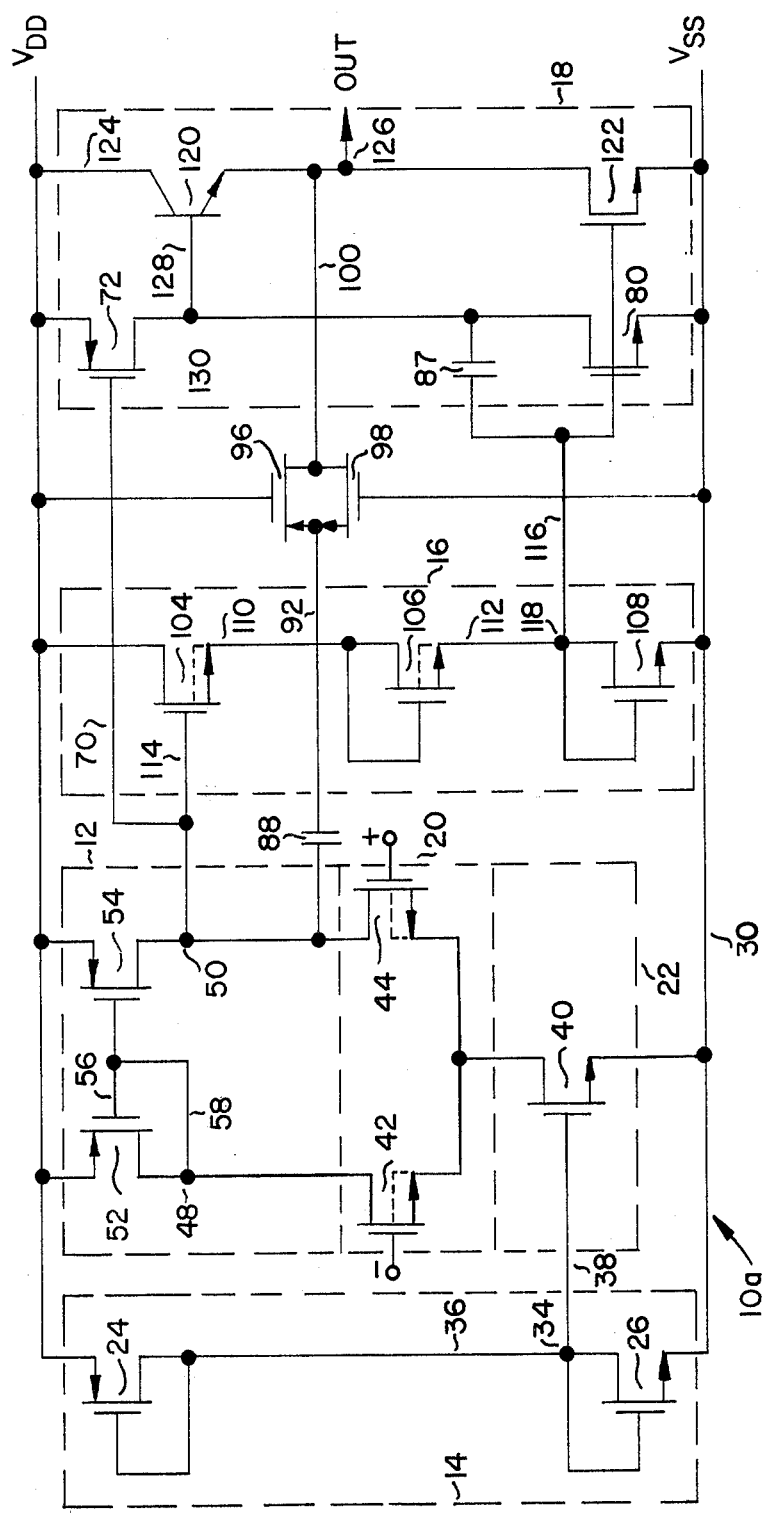
FIG. 4 is a circuit diagram for an operational amplifier comprising another embodiment of the invention.

FIG. 4 shows another embodiment of this invention. This invention combines level shift stage 16 having MOSFETs 104, 106 and 108 and output stage 18. Output stage 18 comprises complementary MOSFETs 72 and 80, and the supplemental output stage (MOSFET 122 and NPN transistor 120) capable of driving low impedance resistance loads.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:
1. An operational amplifier comprising:
a first and a second conductor, said first conductor connected to a first voltage source and said second conductor connected to a second voltage source;
a bias section connected between said pair of conductors, said bias section having an output terminal;
a differential amplifier section, connected between said first and second conductors including a constant current element connected to said output terminal of said bias section, said differential amplifier section including an input section for receiving positive and negative input signals and an output terminal;
a Class A-B output section connected between said first and second conductors, said output section comprising a pair of complementary MOS transistors connected in series each transistor including a control terminal, and said output section having an output terminal for providing an output signal related to said input signals;
first means for connecting said output terminal of said differential amplifier directly to the control terminal of one of said transistors of said output section;
a level shift section connected between said pair of conductors, said level shift section having an output terminal, wherein said level shift section comprises three MOS transistors connected in series between said first and second conductors, each of said three MOS transistors having a gate electrode and one of said three MOS transistors having its gate electrode connected to said differential amplifier output terminal by a second means for connecting;
third means for connecting said level shift section output terminal to the control terminal of the other transistor of said output section; and
a supplementary output stage having an output terminal, said supplementary output stage comprising a bipolar transistor having its base connected to said output node of said output stage, whereby said supplementary output stage provides a relatively low output impedance on said output terminal.

2. The operational amplifier as described in claim 1, wherein said supplementary output stage comprises an NPN transistor and an N-channel MOS transistor connected in series between said power conductors, the base of said NPN transistor being connected to said output section and the gate of said N-channel MOS transistor being connected to said third connecting means from said level shift section.

3. The operational amplifier as described in claims 1 or 2, wherein said differential amplifier comprises a load section connected to its said input section, said load and input sections each comprised of pairs of MOS transistors.

* * * * *

UNITED STATES PATENT AND TRADEMARK OFFICE
CERTIFICATE OF CORRECTION

PATENT NO. : 4,335,355
DATED : June 15, 1982
INVENTOR(S) : Yusuf A. Haque

It is certified that error appears in the above—identified patent and that said Letters Patent is hereby corrected as shown below:

In column 1, lines 6 and 7, delete "patent application" and insert --Patent Application--;

In column 2, line 46, delete "amplifiers" and insert --amplifier--.

Signed and Sealed this

Twelfth Day of July 1983

[SEAL]

Attest:

*Attesting Officer*

GERALD J. MOSSINGHOFF

*Commissioner of Patents and Trademarks*